United States Patent
Numaguchi

(10) Patent No.: US 8,945,988 B2
(45) Date of Patent: Feb. 3, 2015

(54) METHOD FOR THINNING, METALIZING, AND DICING A SEMICONDUCTOR WAFER AND, SEMICONDUCTOR DEVICE MADE USING THE METHOD

(71) Applicant: LAPIS Semiconductor Co., Ltd., Yokohama (JP)

(72) Inventor: Hiroyuki Numaguchi, Miyazaki (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 14/018,518

(22) Filed: Sep. 5, 2013

(65) Prior Publication Data
US 2014/0070374 A1    Mar. 13, 2014

(30) Foreign Application Priority Data
Sep. 10, 2012   (JP) .................................. 2012-198529

(51) Int. Cl.
| | |
|---|---|
| H01L 21/44 | (2006.01) |
| H01L 21/48 | (2006.01) |
| H01L 21/50 | (2006.01) |
| H01L 21/00 | (2006.01) |
| H01L 21/30 | (2006.01) |
| H01L 21/46 | (2006.01) |
| H01L 21/78 | (2006.01) |
| H01L 21/301 | (2006.01) |
| H01L 21/02 | (2006.01) |
| H01L 23/544 | (2006.01) |

(52) U.S. Cl.
CPC ........ *H01L 21/02016* (2013.01); *H01L 23/544* (2013.01)

USPC ............. 438/113; 438/68; 438/110; 438/458; 438/459; 438/462

(58) Field of Classification Search
CPC ................... H01L 21/76251; H01L 21/76254; H01L 2924/01079; H01L 2924/01029; H01L 21/78; H01L 23/544; H01L 21/6835
USPC ........... 438/110, 113, 114, 458, 462, 68, 459, 438/464
See application file for complete search history.

(56) References Cited

U.S. PATENT DOCUMENTS

| | | | |
|---|---|---|---|
| 2006/0141750 A1* | 6/2006 | Suzuki et al. | 438/460 |
| 2013/0210215 A1* | 8/2013 | Xue et al. | 438/462 |

FOREIGN PATENT DOCUMENTS

| | | |
|---|---|---|
| JP | 2008-187148 A | 8/2008 |
| JP | 4749849 B2 | 8/2011 |

* cited by examiner

*Primary Examiner* — A. Sefer
*Assistant Examiner* — Dilinh Nguyen
(74) *Attorney, Agent, or Firm* — Rabin & Berdo, P.C.

(57) ABSTRACT

There is provided a method of fabricating a semiconductor device, method including: a) forming semiconductor elements in plural element regions surrounded by assumed dicing lines on a first principal surface of a semiconductor wafer; b) grinding the second principal surface in such a way that an outer peripheral portion of a second principal surface on the opposite side of the first principal surface of the semiconductor wafer becomes thicker than an inner peripheral portion of the second principal surface; c) forming a metal film, in such a way as to avoid sections corresponding to the dicing lines, on the second principal surface that has been ground in the grinding step; and d) cutting the semiconductor wafer from the second principal surface side along portions where the metal film is not formed on the dicing lines.

19 Claims, 9 Drawing Sheets

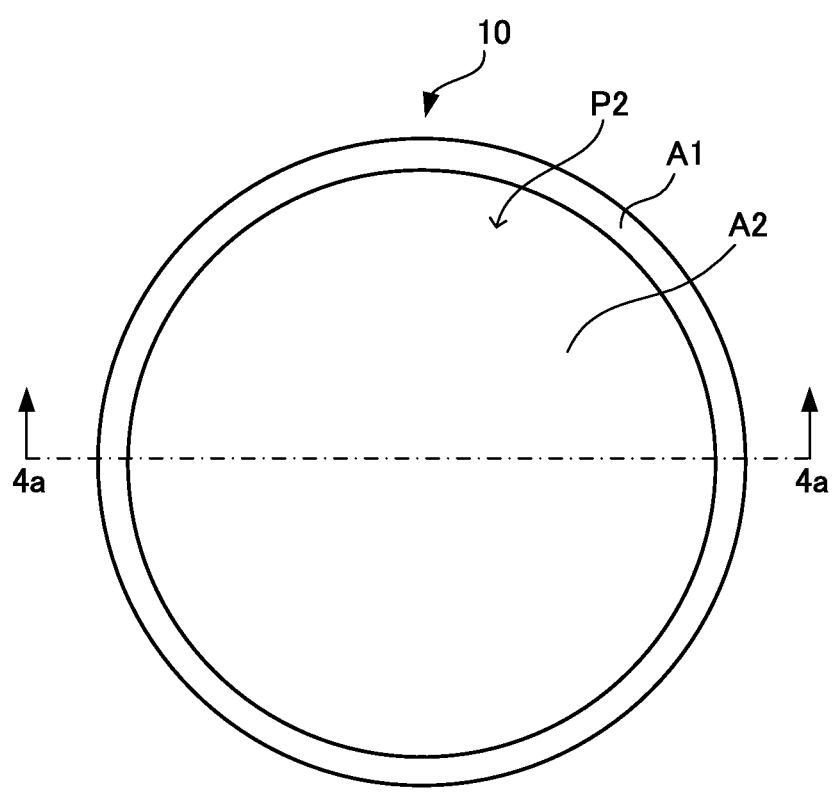

METHOD FOR THINNING, METALIZING, AND DICING A SEMICONDUCTOR WAFER AND, SEMICONDUCTOR DEVICE MADE USING THE METHOD

CROSS-REFERENCE TO RELATED APPLICATION

This application is based on and claims priority under 35 USC 119 from Japanese Patent Application No. 2012-198529 filed on Sep. 10, 2012, the disclosure of which is incorporated by reference herein.

BACKGROUND

1. Technical Field

The present invention relates to a semiconductor device and a method of fabricating a semiconductor device.

2. Related Art

In accompaniment with the spread of system-in-package technologies in recent years, processing techniques for thinning semiconductor wafers have been receiving attention. For example, in the field of stack packages used in mobile telephones and so forth, products in which plural chips that have been thinned to 100 µm or less are stacked inside a package are being developed. Processing for thinning a semiconductor wafer is performed by forming circuit elements and so forth on the semiconductor wafer and thereafter using a back-grinding wheel to grind the back surface of the wafer. As the thinning of the semiconductor wafer progresses, chipping, chip breakage, and warping of the semiconductor wafer occur, and the problem of a drop in yield and a drop in productivity occurs. In order to solve this problem, the technique of leaving about 3 mm, for example, of the outer peripheral portion from the outer edge of the semiconductor wafer and grinding and thinning only the inner peripheral portion of the semiconductor wafer is known. Introducing this technique makes it possible to reduce wafer conveyance risks and warping.

Japanese Patent No. 4,749,849 describes a wafer that has an annular reinforcement on the outer periphery of the back surface of the wafer, with the entire back surface of the wafer being covered with a metal film, wherein the positions of streets formed on the front surface of the wafer are detected by removing the metal film on the annular reinforcement, and the wafer is cut from the back surface side along the streets that have been detected.

Further, Japanese Patent Application Laid-Open (JP-A) No. 2008-187148 describes forming a rib structure on the back surface of a semiconductor wafer by removing the back surface of the semiconductor wafer to a predetermined depth while leaving a predetermined width from the outer peripheral end portion, forming a metal electrode film on the back surface of the semiconductor wafer on which the rib structure has been formed, forming a semiconductor wafer cutting position adjustment mark on the back surface of the semiconductor wafer on the basis of the position in which a front surface-side element structure portion captured by a camera disposed on the front surface side of the semiconductor wafer is formed, and cutting the semiconductor wafer into chips by using this cutting position adjustment mark.

In the dicing step of separating the semiconductor wafer into chips, ordinarily dicing tape is adhered to the back surface side of the semiconductor wafer and the semiconductor wafer is set in a dicing machine with the semiconductor wafer being supported on the dicing tape. Thereafter, dicing is performed by running a dicing blade along dicing lines or scribe lines defined on the front surface of the semiconductor wafer.

However, a semiconductor wafer that has been thinned by grinding only the inner peripheral section of the back surface of the semiconductor wafer such as described above has a step-like difference in height between its outer peripheral portion and its inner peripheral portion. Adhering dicing tape to the back surface of a semiconductor wafer having such a step-like difference in height to thereby stably support the semiconductor wafer is difficult. For this reason, the outer peripheral section of the back surface of the semiconductor wafer is ground, so that the back surface of the wafer is flattened, in another grinding step after a back surface electrode formation step and an inspection step. However, in this case, two grinding steps become necessary, which leads to an increase in costs. For this reason, adhering the dicing tape to the front surface side of a wafer not having a step-like difference in height and performing dicing from the back surface side of the wafer is preferred. In the case of performing dicing from the back surface side of the wafer, it is necessary to run the dicing blade along dicing lines defined on the front surface side of the wafer.

Here, if the device is one that outputs electric current from the back surface of the semiconductor chip, a metal film configuring a back surface electrode is formed on the back surface of the wafer before the semiconductor wafer is separated into chips. This metal film has the role of imparting solder wettability and conductivity to the back surface side of the semiconductor chip. Consequently, in the dicing step, the metal film configuring the back surface electrode is also cut at the same time together with the semiconductor wafer. However, there is the problem that when the dicing blade cuts the metal film together with the semiconductor wafer, the dicing blade tends to become stuck and the life of the dicing blade becomes shorter.

SUMMARY

The present invention has been made in view of the points described above, and it is an object thereof to provide a semiconductor device and a semiconductor device fabricating method that make it possible for a semiconductor wafer that has been thinned by grinding only the inner peripheral portion of one principal surface thereof and which has a metal film formed on the one surface to be diced from the one surface and can prevent a dicing blade from becoming stuck.

A first aspect of the present invention provides a method of fabricating a semiconductor device, method including:

a) forming semiconductor elements in plural element regions surrounded by assumed dicing lines on a first principal surface of a semiconductor wafer;

b) grinding the second principal surface in such a way that an outer peripheral portion of a second principal surface on the opposite side of the first principal surface of the semiconductor wafer becomes thicker than an inner peripheral portion of the second principal surface;

c) forming a metal film, in such a way as to avoid sections corresponding to the dicing lines, on the second principal surface that has been ground in the grinding step; and d) cutting the semiconductor wafer from the second principal surface side along portions where the metal film is not formed on the dicing lines.

A second aspect of the present invention provides a semiconductor device fabricated by the method of the first aspect, wherein the semiconductor device has, on a surface corresponding to the second principal surface of the semiconductor wafer, the portions where the metal film is not formed on an outer peripheral region along cut surfaces that appear in the cutting d).

According to the semiconductor device and the semiconductor device fabricating method pertaining to the present invention, the device and method make it possible for a semiconductor wafer that has been thinned by grinding only the inner peripheral portion of one principal surface thereof and which has a metal film formed on the one surface to be diced from the one surface, and it becomes possible to prevent a dicing blade from becoming stuck.

BRIEF DESCRIPTION OF THE DRAWINGS

An exemplary embodiment of the present invention will be described in detail based on the following figures, wherein:

FIG. 3 is a plan view showing, as seen from a second principal surface P2 side, the semiconductor wafer on which grinding has been performed;

DETAILED DESCRIPTION

Figure 1:
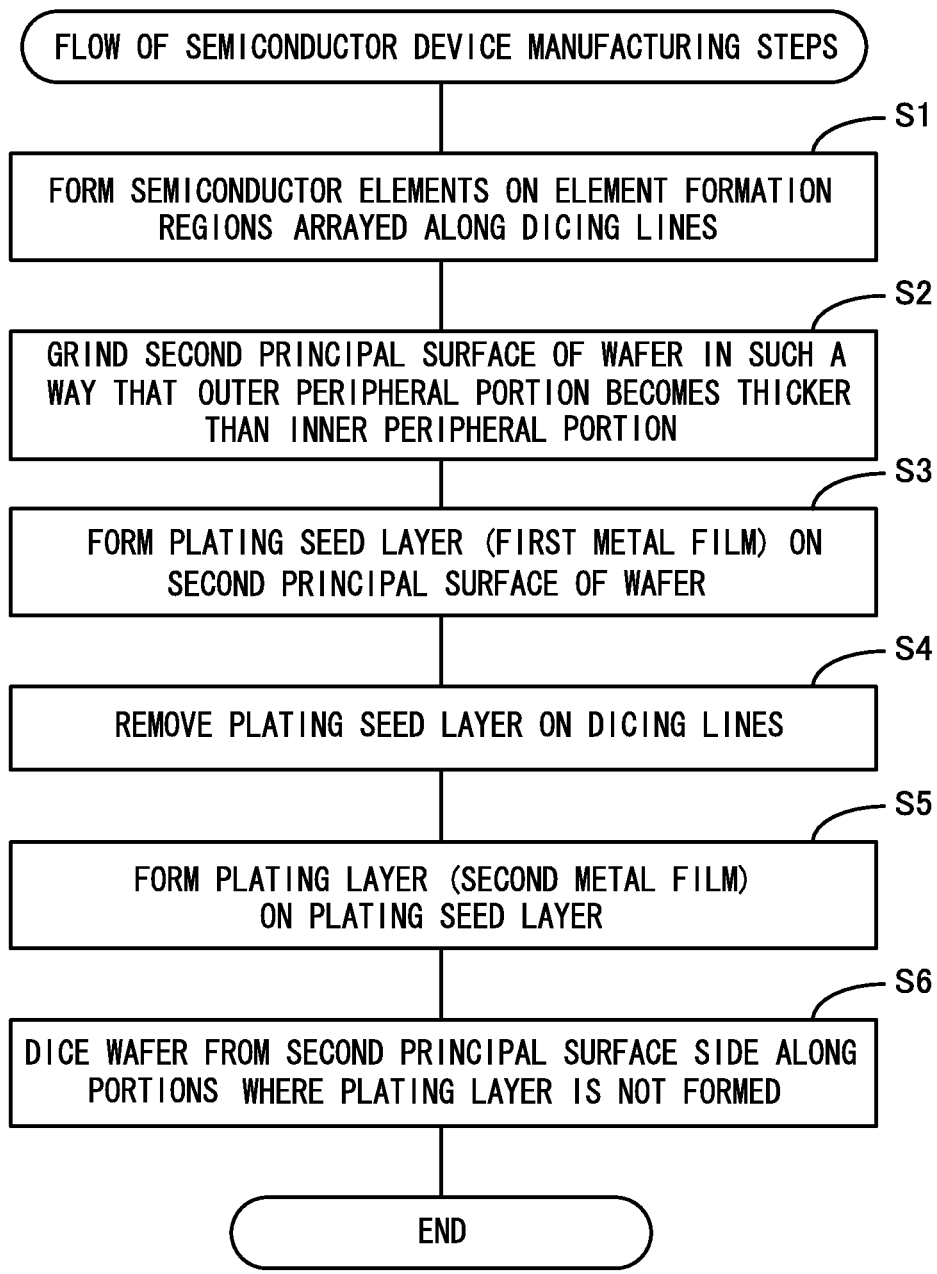
FIG. 1 is a fabricating step flowchart showing a semiconductor device fabricating method pertaining to the exemplary embodiment of the present invention.

An exemplary embodiment of the present invention will be described below with reference to the drawings. In the drawings, the same reference signs are assigned to constituent elements that are the same as, or equivalent to, one another.

Figure 2:
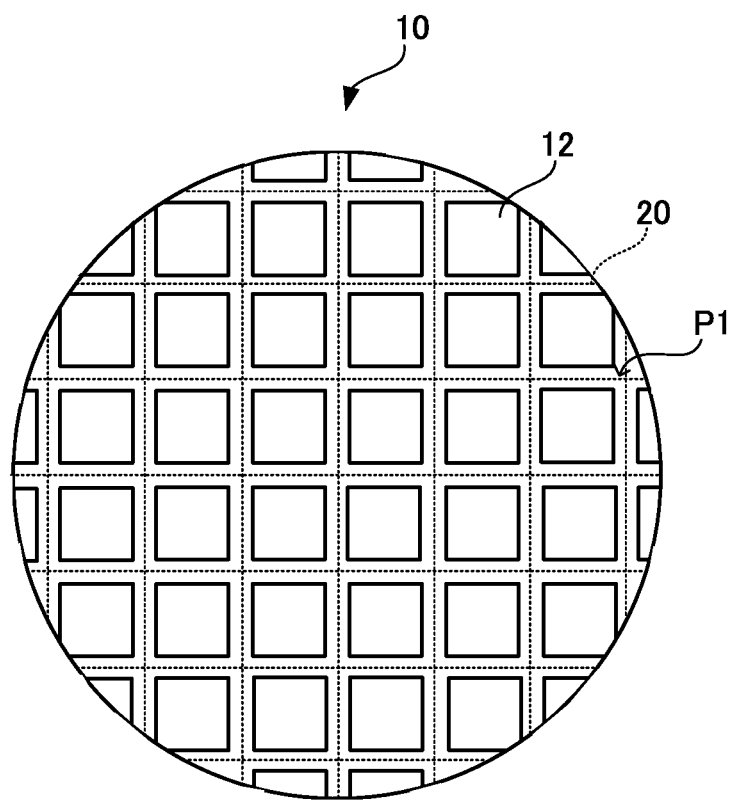
FIG. 2 is a plan view showing, as seen from a first principal surface P1 side, a semiconductor wafer used in the manufacture of a semiconductor device pertaining to the exemplary embodiment of the present invention.

FIG. 1 is a fabricating step flowchart showing a semiconductor device fabricating method pertaining to the exemplary embodiment of the present invention. FIG. 2 is a plan view showing, as seen from a first principal surface P1 side, a semiconductor wafer 10 used in the fabrication of a semiconductor device pertaining to the exemplary embodiment of the present invention. The semiconductor wafer 10 is a silicon wafer, for example, and has a first principal surface P1 and a second principal surface P2 (see FIG. 3) on the opposite side of the first principal surface P 1. The first principal surface P1 is an element formation surface on which various processes, such as ion implantation and wire formation, for forming semiconductor elements on the semiconductor wafer 10 are performed. The second principal surface P2 of the semiconductor wafer 10 corresponds to a joining surface for electrically or mechanically joining a separated semiconductor device to a package member such as a mounting substrate.

Plural element formation regions 12 are defined on the first principal surface P1 of the semiconductor wafer 10. The plural element formation regions 12 are arrayed in such a way that mutually adjacent element formation regions are spaced a predetermined distance apart from one another. Dicing lines 20 are defined on the first principal surface P1 of the semiconductor wafer 10 in accordance with the array of the plural element formation regions 12. The dicing lines 20 are grid-like lines passing in between the element formation regions 12 and are dividing lines when separating plural semiconductor devices formed within the semiconductor wafer 10 into chips.

First, semiconductor elements are formed in the plural element formation regions 12 (step S1). The semiconductor elements are discrete elements such as MOSFETs, for example, with gate regions and source regions being disposed on the first principal surface P1 side and drain regions being disposed on the second principal surface P2 side. However, the semiconductor elements formed in the element formation regions 12 may also be other discrete elements, such as bipolar transistors or IBGTs, or may also be integrated circuits such as CMOS circuits. These semiconductor elements are formed by well-known processes including a film formation step, an ion implantation step, an etching step, and a wiring step.

Figure 4A:
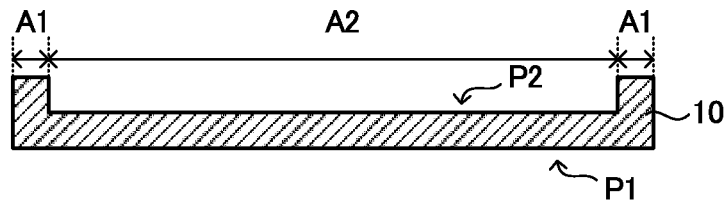
FIG. 4A to FIG. 4G are sectional views showing the semiconductor device fabricating method pertaining to the exemplary embodiment of the present invention.
Figure 4B:
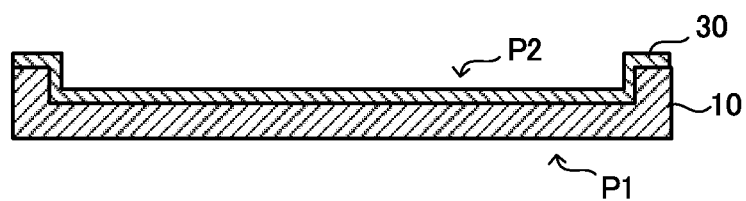

Next, the second principal surface P2 of the semiconductor wafer 10 is ground to thereby thin the semiconductor wafer 10 (step S2). FIG. 3 is a plan view showing, as seen from the second principal surface P2 side, the semiconductor wafer 10 on which the grinding has been performed. FIG. 4A is a sectional view along line 4a-4a in FIG. 3. In the present step, a protective tape covering the entire first principal surface P1 is adhered to the semiconductor wafer 10, and the semiconductor wafer 10 is placed on a support table (not shown in the drawings) of a back grinder with the second principal surface P2 side facing up. Then, a grinding wheel of the back grinder is set into rotation and brought into contact with the second principal surface P2 of the semiconductor wafer 10, whereby the semiconductor wafer 10 is ground from the second principal surface P2 side. The grinding wheel is brought into contact only with an inner peripheral portion A2 of the second principal surface P2 of the semiconductor wafer 10, so that only the inner peripheral portion A2 is ground. Because of this, the initial thickness (e.g., 500 μm) of the semiconductor wafer 10 is maintained at its outer peripheral portion A1, which has a dimension of about 3 mm from the outer edge of the semiconductor wafer 10, while the inner peripheral portion A2 is thinned to about 50 μm, for example. Because of this, a recessed portion is formed in the inner peripheral portion A2 on the second principal surface P2 side of the semiconductor water 10. In this way, by grinding the semiconductor wafer 10 while ensuring the thickness of the outer peripheral portion Al of the semiconductor wafer 10, it becomes possible to suppress the occurrence of warping of the semiconductor wafer 10 and ensure the stiffness of the semiconductor wafer 10 after the thinning Because of this, the handling of the semiconductor wafer 10 can be improved and processing from the present step on becomes easy.

Next, aluminum (Al) is deposited by vapor deposition or sputtering on the second principal surface P2 of the semiconductor wafer 10 on which the grinding has been performed, whereby a plating seed layer (a first metal film) 30 is formed on the entire second principal surface P2 (step S3). The plating seed layer 30 has a role as a layer on which plating is to be performed to form a later-described plating layer 50.

Next, the sections of the plating seed layer 30 coinciding with the dicing lines 20 defined on the first principal surface P1 side of the semiconductor wafer 10 are removed. That is, the plating seed layer 30 is partially removed in such a way that the sections from which the plating seed layer 30 is removed become like grid lines coinciding with the dicing lines 20 (step S4). FIG. 4A to FIG. 4E are sectional views corresponding to the present step S4. The present step will be described below with reference to these drawings.

Figure 4C:
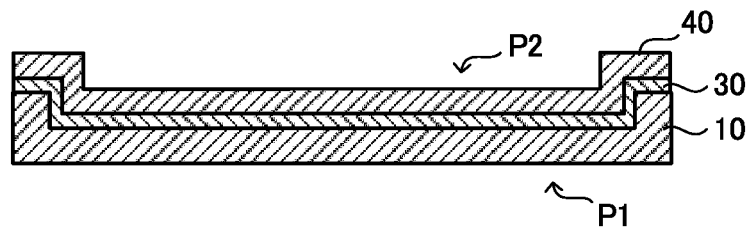

A photosensitive resist 40 is formed on the plating seed layer 30 as shown in FIG. 4C. Next, the photosensitive resist 40 is exposed to light via a glass mask 100 (see FIG. 5) having translucent portions corresponding to the grid-like lines of the dicing lines 20. The glass mask 100 is positioned with respect to the semiconductor wafer 10 using a double-sided aligner, for example.

Figure 5:
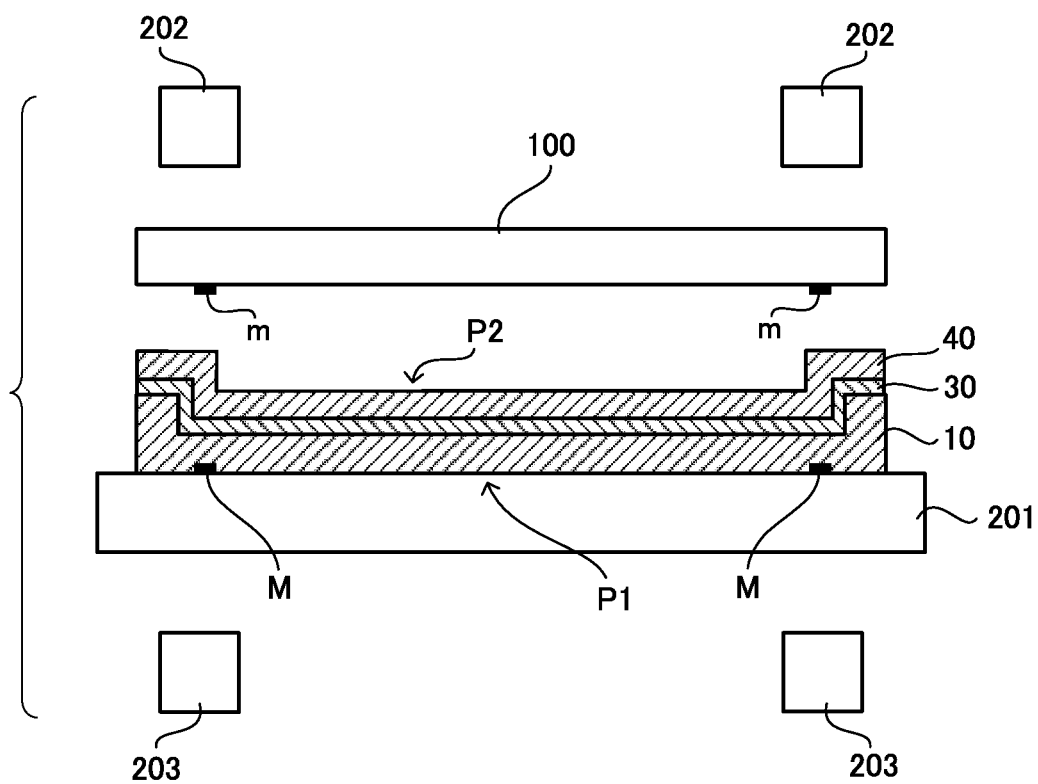
FIG. 5 is a schematic diagram showing a method of aligning a glass mask using a double-sided aligner.

FIG. 5 is a schematic diagram showing a method of aligning the glass mask 100 using a double-sided aligner. The double-sided aligner includes a stage 201 for placing the semiconductor wafer 10 thereon, two objective lenses 202 placed above the stage 201, and two objective lenses 203 placed below the stage 201. In the present step, the semiconductor wafer 10 is placed on the stage 201 in such a way that the second principal surface P2 side faces up (that is, in such a way that the first principal surface P1 contacts the stage 201). Alignment marks M for performing alignment of the glass mask 100 are formed beforehand on the first principal surface P1 of the semiconductor wafer 10.

The stage 201 is configured by a transparent member such as glass, and the alignment marks M formed on the first principal surface P1 of the semiconductor wafer 10 placed on the stage 201 can be viewed using the objective lenses 203 disposed below the stage 201. Marks m corresponding to the alignment marks M are also formed on the glass mask 100, and the marks m can be viewed using the objective lenses 202 disposed above the stage 201. Further, the alignment marks M on the semiconductor wafer 10 viewed using the objective lens 202 and the marks m on the glass mask 100 viewed using the objective lens 203 can be viewed superposed in the viewing field. Additionally, the alignment of the glass mask 100 is performed in such a way that the alignment marks M on the semiconductor wafer 10 and the marks m on the glass mask 100 coincide with one another. Because of this, the glass mask 100 is aligned with respect to the dicing lines 20 defined on the first principal surface P1 side of the semiconductor wafer 10.

Figure 4D:
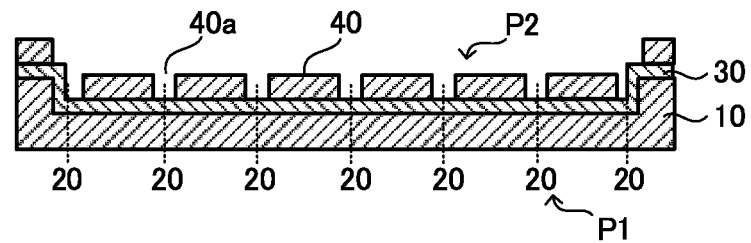

The photosensitive resist 40 is exposed to light via the glass mask 100 that has been aligned in this way. Thereafter, as shown in FIG. 4D, the section of the photosensitive resist 40 that has been exposed to light is removed by development, whereby a grid-like open portion 40a coinciding with the dicing lines 20 on the first principal surface P1 side is formed in the photosensitive resist 40 in the principal surface direction of the semiconductor wafer 10.

Figure 4E:
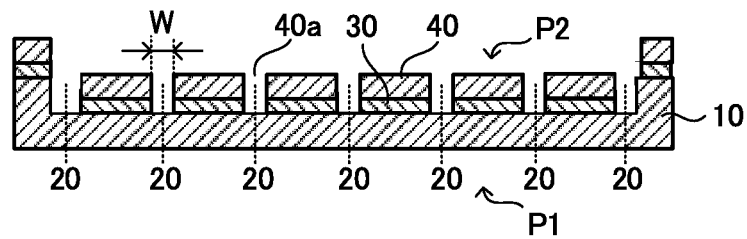
Figure 4F:
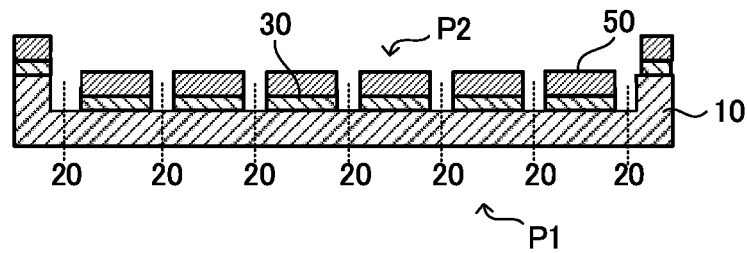

Next, as shown in FIG. 4E, the plating seed layer 30 that is exposed in the grid-like open portion 40a of the photosensitive resist 40 along the dicing lines 20 is removed by etching. That is, the grid-like region of the plating seed layer 30 coinciding with the dicing lines 20 defined in the first principal surface P1 is removed. The base material of the semiconductor wafer 10 becomes exposed in the section from which the plating seed layer 30 has been removed. It is preferred that a width W of the section of the plating seed layer 30 that has been removed along the dicing lines 20 be larger than the cutting width (dicing blade width) when dicing the semiconductor wafer 10.

Next, as shown in FIG. 4, a plating layer (a second metal film) 50 is formed on the plating seed layer 30 (step S5). In the present exemplary embodiment, the plating layer 50 is formed by layering a gold (Au) plating layer on a nickel (Ni) plating layer. The plating layer 50 is selectively formed only on the plating seed layer 30 by electroless plating, for example. The plating layer 50 is formed as follows, for example.

First, the Ni plating layer is formed by electroless plating on the plating seed layer 30. As the nickel plating bath, for example, a bath in which sodium hypophosphite ($H_2NaO_2P$) has been added as a reducing agent to nickel sulfate ($NiSO_4$) can be used. The nickel plating layer can be selectively formed on the plating seed layer 30 by this nickel plating. That is, the Ni plating layer is formed only on the sections of the semiconductor wafer 10 where the plating seed layer 30 exists, and the Ni plating layer is not formed on the sections from which the plating seed layer 30 has been removed. The Ni plating layer functions as an underlying layer for forming the later-described Au plating layer.

Next, the Au plating layer is formed on the Ni plating layer by electroless plating. The Au plating layer can be formed using immersion Au plating and reduction Au plating, which are types of electroless plating Immersion Au plating utilizes the difference between the ionization tendency of the underlying metal to be plated (in the present exemplary embodiment, Ni) and the ionization tendency of Au that is the plating material. The semiconductor wafer 10 on which the Ni plating layer has been formed is immersed in a cyanide or cyanide-free immersion gold plating bath. In the plating bath, a reaction occurs in which the underlying Ni, whose ionization tendency is relatively large, dissolves and the Au separates out onto the Ni plating layer. In immersion Au plating, the reaction stops at the point in time when the underlying Ni plating layer becomes covered with Au, so the film thickness of the separated-out Au ends up becoming thin. Therefore, in the present exemplary embodiment, reduction plating is performed after the immersion plating to ensure the film thickness of the Au plating layer. However, in a case in which it is not necessary to ensure the film thickness of the Au plating layer, just the immersion plating may be performed.

Reduction Au plating is a plating method in which electrons released by the oxidation of a reducing agent included in the plating bath transfer to Au ions to form an Au film on a material on which plating is to be performed. A reduction Au plating layer is further formed on the immersion Au plating layer by immersing the semiconductor wafer 10 in a plating bath using potassium borohydride ($KBH_4$) as a reducing agent and $KAu(CN)_2$ as a gold salt, for example.

The Au plating layer can be selectively formed on the Ni plating layer by this Au plating. That is, the plating layer 50 including the Ni plating layer and the Au plating layer is formed only on the sections of the semiconductor wafer 10 where the plating seed layer 30 exists, and the plating layer 50 is not formed on the sections from which the plating seed layer 30 has been removed.

Figure 6:
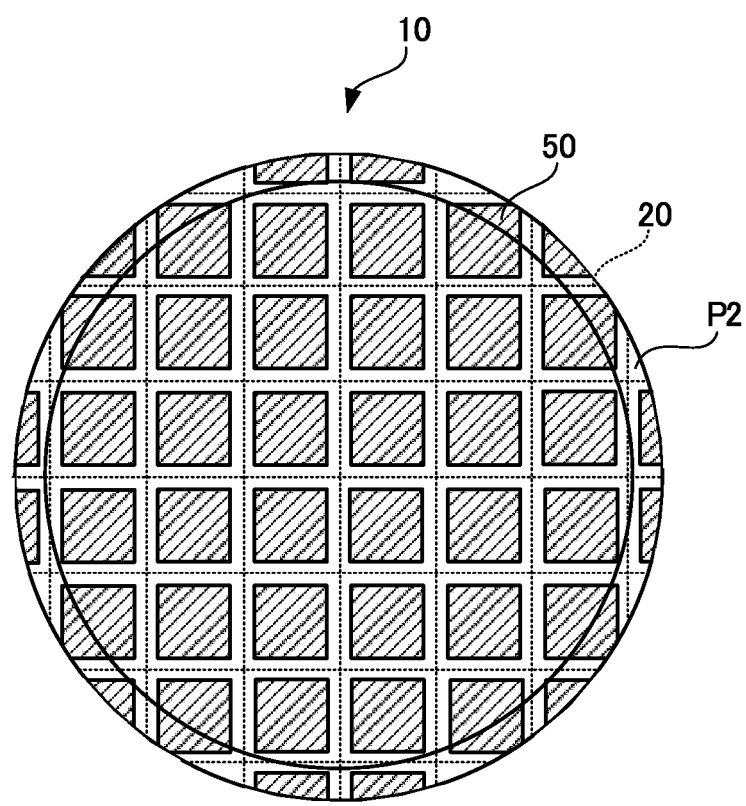
FIG. 6 is a plan view showing, as seen from the second principal surface side, the semiconductor wafer pertaining to the exemplary embodiment of the present invention, with a plating layer having been formed thereon.

FIG. 6 is a plan view showing, as seen from the second principal surface P2 side, the semiconductor wafer 10 having the plating layer 50 formed thereon. On the second principal surface P2 of the semiconductor wafer 10, the plating layer 50 is patterned in such a way that the portions where the plating layer 50 is not formed coincide with the dicing lines 20 defined on the first principal surface P1 side. In other words, on the second principal surface P2 of the semiconductor wafer 10, the plating layer 50 is formed in such a way as to avoid the dicing lines 20 defined on the first principal surface P1 side. The base material of the semiconductor wafer 10 is exposed in the portions where the plating layer 50 is not formed.

Figure 4G:
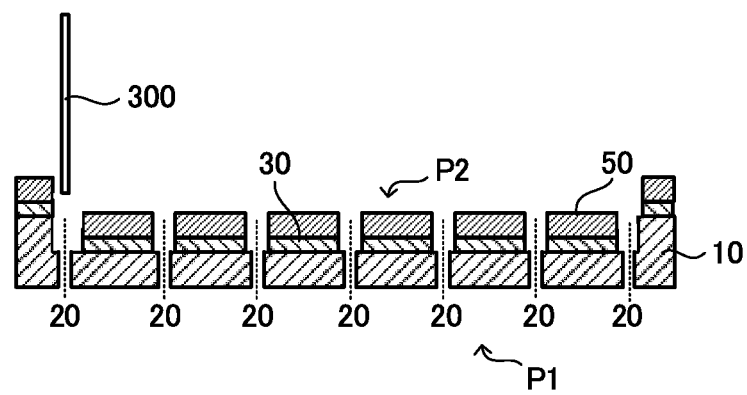

Next, as shown in FIG. 4G, the semiconductor wafer 10 is cut from the second principal surface P2 side along the portions where the plating layer 50 is not formed, to thereby separate semiconductor devices (step S6). In the present step, the semiconductor wafer 10 is supported and set in a dicing machine (not shown in the drawings) with dicing tape being adhered to the first principal surface P1 whose front surface is flat. A dicing blade 300, with which the dicing machine is equipped, is inserted into the semiconductor wafer 10 from the second principal surface P2 side. The dicing machine image-recognizes the pattern of the plating layer 50 on the second principal surface P2 of the semiconductor wafer 10 and runs the dicing blade 300 along the portions where the plating layer 50 is not formed. Because of this, the semiconductor wafer 10 is cut along the dicing lines 20 defined on the first principal surface P1 of the semiconductor wafer 10, and individual dies (semiconductor chips) for semiconductor devices are cut out. The plating seed layer 30 and the plating layer 50 are not formed on the running lines of the dicing blade 300, so the dicing blade 300 can be prevented from becoming stuck. Semiconductor devices are completed through the above steps.

Figure 7A:
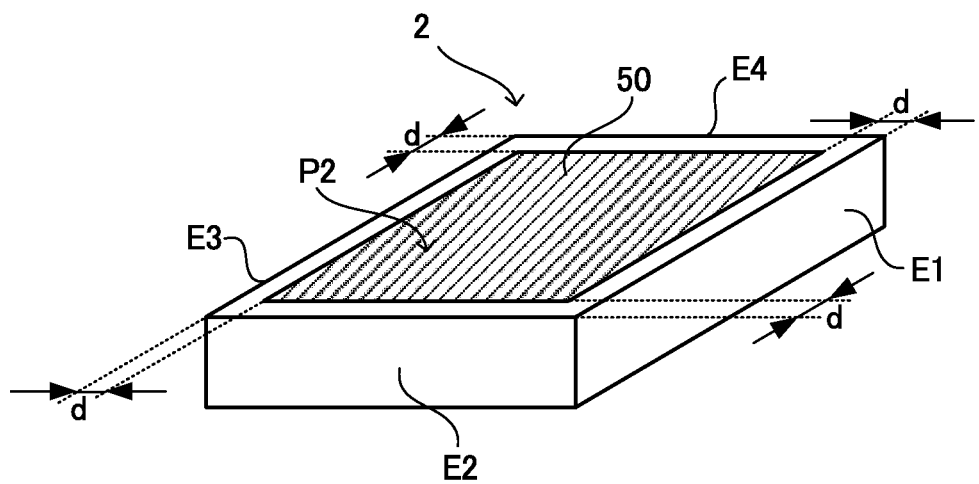
FIG. 7A is a perspective view of a separated semiconductor device pertaining to the exemplary embodiment of the present invention.

FIG. 7A is a perspective view of a semiconductor device 2 that has been separated in the dicing step. In FIG. 7A, the semiconductor device 2 is shown with the second principal surface P2 side facing up. The semiconductor device 2 has cut surfaces E1 to E4 that appear as a result of the semiconductor wafer 10 being cut along the dicing lines 20.

According to the semiconductor device fabricating method pertaining to the present exemplary embodiment, on the second principal surface P2, the plating layer 50 is not formed on the dicing lines 20, so in the die for the semiconductor device 2 that has been cut out by the dicing, the plating layer 50 extends inward from each of the cut surfaces E1 to E4, with a distance d being left between the plating layer 50 and each of the cut surfaces E1 to E4 as shown in FIG. 7A. That is, the semiconductor device 2 has, on its outer peripheral portion along each the cut surfaces E1 to E4, a portion where the plating layer 50 is not formed, and the plating layer 50 is disposed inside the outer peripheral portion.

Figure 7B:
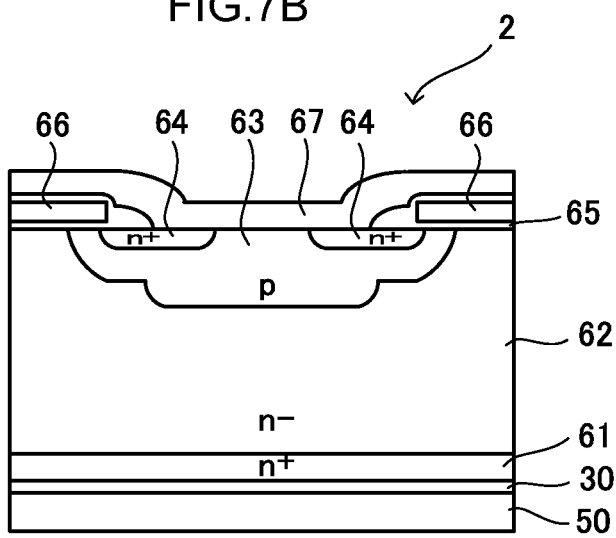
FIG. 7B is a sectional view of the semiconductor device.

FIG. 7B is a sectional view showing the configuration of the semiconductor device 2 pertaining to the exemplary embodiment of the present invention. In FIG. 7B, a case, in which the semiconductor device 2 is configured as a MOS-FET, is shown as an example. The semiconductor device 2 includes a high-concentration n-type diffusion region 61 that functions as a drain region, a low-concentration n-type diffusion region 62 that is disposed on the n-type diffusion region 61, a p-type diffusion region 63 that is disposed on the surface layer portion of the low-density n-type diffusion region 62 and forms a channel region, and an n-type diffusion region 64 that is disposed on the surface layer portion of the p-type diffusion region 63 and functions as a source region. These diffusion regions 61 to 64 are formed by implanting a predetermined conductive type of impurity ions from the first principal surface P1 of the semiconductor wafer 10.

The plating seed layer 30 and the plating layer 50 that function as a drain electrode are formed on the front surface of the drain region 61 disposed on the second principal surface P2 side of the semiconductor wafer 10. A gate oxidation film 65, a gate electrode 66, and a source electrode 67 are disposed on the first principal surface P1 side of the semiconductor wafer 10. In the semiconductor device 2 having this configuration, the plating layer 50 on the second principal surface P2 side is made to serve as a joining layer when joining the semiconductor device 2 to an unillustrated package member such as a mounting substrate.

As is apparent from the above description, according to the semiconductor device fabricating method pertaining to the present exemplary embodiment, in the step of thinning the semiconductor wafer 10, only the inner peripheral portion A2 of the semiconductor wafer 10 is ground so that the initial thickness of the semiconductor wafer 10 is maintained at the outer peripheral portion Al, so warping of the semiconductor wafer 10 can be reduced and it becomes possible to maintain the stiffness of the semiconductor wafer 10. Because of this, the handling of the semiconductor wafer 10 can be improved.

Further, according to the semiconductor device fabricating method pertaining to the present exemplary embodiment, on the second principal surface P2 of the semiconductor wafer 10, the plating layer 50 is formed in such a way as to avoid the dicing lines 20 defined on the first principal surface P1 side. Consequently, by performing an image-recognition of the grid-like line pattern that is formed in the plating layer 50 and is along the dicing lines 20, it becomes possible to perform the dicing from the second principal surface P2 side of the semiconductor wafer 10.

Further, according to the semiconductor device fabricating method pertaining to the present exemplary embodiment, the plating seed layer 30 and the plating layer 50 are not formed on the dicing lines 20, so the dicing blade does not cut a metal film. Because of this, the dicing blade can be prevented from becoming stuck and the life span of the dicing blade can be extended.

Further, there are many cases where an expensive rare metal such as gold (Au), silver (Ag), platinum (Pt), or palladium (Pd) is used for the plating layer 50 in consideration of solder wettability and conductivity when soldering a separated semiconductor device to a package member such as a mounting substrate. According to the semiconductor device fabricating method pertaining to the present exemplary embodiment, the plating seed layer 30 and the plating layer 50 are not formed on the dicing lines 20, so the production of the rare metal configuring the plating layer 50 can be reduced, and because of this a reduction in cost can be realized.

In the above embodiment, a grid-like pattern corresponding to the dicing lines 20 was formed in the plating seed layer 30 by etching the plating seed layer 30 formed on the second principal surface P2 of the semiconductor wafer 10, but the plating seed layer 30 may also be patterned using the lift-off technique described below.

Figure 8A:
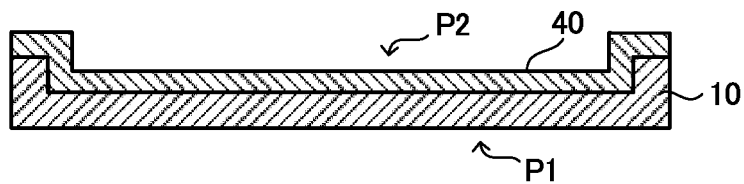
FIG. 8A to FIG. 8E are sectional views showing a semiconductor device fabricating method pertaining to another exemplary embodiment of the present invention.

FIG. 8A to FIG. 8E are sectional views showing the step of patterning the plating layer 30 using the lift-off technique. The photosensitive resist 40 is formed on the entire second principal surface P2 of the semiconductor wafer 10 for which the grinding step has ended (FIG. 8A).

Figure 8B:
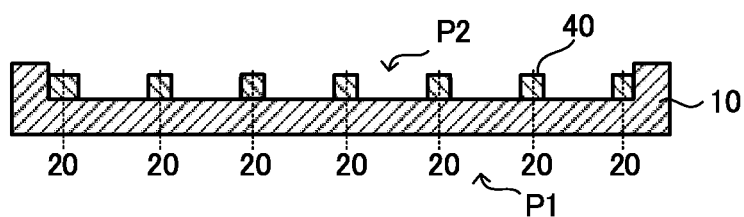

Next, patterning of grid-like lines aligned with respect to the dicing lines 20 on the first principal surface P1 side is performed on the photosensitive resist 40 by photolithography using the double-sided aligner. That is, the regions of the photosensitive resist 40 outside the grid-like region corresponding to the dicing lines 20 are removed (FIG. 8B).

Figure 8C:
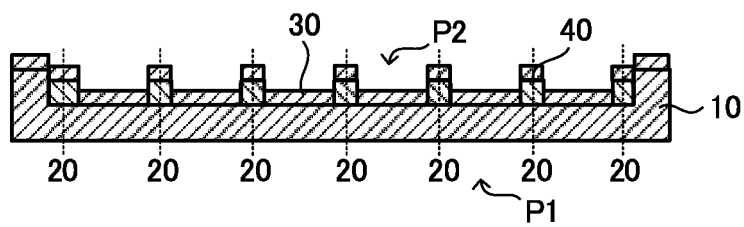

Next, the plating seed layer 30 is formed on the second principal surface P2 of the semiconductor wafer 10, with the photosensitive resist 40 that has been patterned as described above being left as is. The plating seed layer 30 is formed on the front surface of the photosensitive resist 40 and on the exposed surface of the semiconductor wafer 10 that has been exposed as a result of the photosensitive resist 40 being removed (FIG. 8C).

Figure 8D:
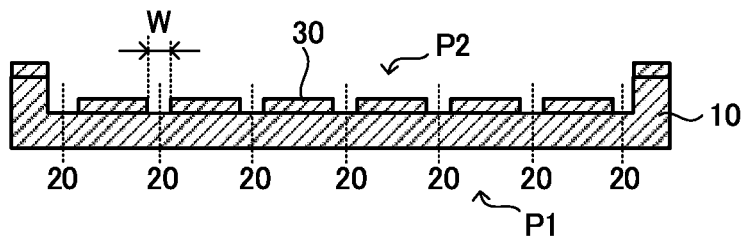

Next, the photosensitive resist 40 is removed together with the plating seed layer 30 deposited on the front surface of the photosensitive resist 40. That is, the plating seed layer 30 is removed along the grid-like lines coinciding with the dicing lines 20 (FIG. 8D).

Figure 8E:
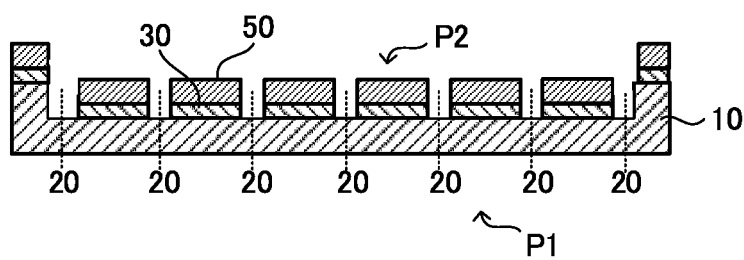

Like in the above embodiment, on the second principal surface P2 of the semiconductor wafer 10, the plating layer 50 is selectively formed only on the sections where the plating seed layer 30 is formed (FIG. 8E). The plating seed layer 30 and the plating layer 50 may also be lifted off at the same time by forming the plating layer 50 and thereafter removing the photosensitive resist 40.

Further, in the above embodiment, the plating layer 50 was configured by two layers—the Ni plating layer and the Au plating layer—but it is also possible to configure the plating layer 50 as a single layer. Further, the metal configuring the plating layer 50 can be appropriately selected in consideration of solder wettability and conductivity. For example, it is possible to use a metal capable of being formed into a film by electroless plating, such as Ag, Pt, and Pd. As for the material of the plating seed layer 30, for example, a metal whose ionization tendency is larger than that of the metal configuring the plating layer 50 can be appropriately selected.

Further, in the above embodiment, a case in which the plating layer 50 formed by plating is formed on the second principal surface P2 of the semiconductor wafer 10 was described as an example, but a metal film formed by another method such as sputtering or vapor deposition may also be formed on the second principal surface P2 of the semiconductor wafer 10 and the metal film may be removed along the dicing lines 20 by etching or the lift-off technique.

Further, in the above embodiment, the dicing lines 20 defined on the first principal surface P1 side and the pattern of the photosensitive resist 40 formed on the second principal surface P2 were aligned by performing the alignment of the glass mask 100 using the double-sided aligner, but alignment marks may also be formed, in alignment with the dicing lines 20, on the second principal surface P2 of the semiconductor wafer 10, and the alignment of the glass mask 100 may be performed using these alignment marks.

What is claimed is:

1. A method of fabricating a semiconductor device, said method comprising:
   (a) forming semiconductor elements in plural element regions surrounded by elongated dicing regions on a first principal surface of a semiconductor wafer;
   (b) grinding a second principal surface, on a side of the semiconductor wafer opposite the first principal surface, in such a way that an outer peripheral portion of the semiconductor wafer becomes thicker than an inner portion of the semiconductor wafer;
   (c) forming a metal film, in such a way as to avoid sections corresponding to the dicing regions, on the second principal surface that has been ground in the grinding step; and
   (d) cutting the semiconductor wafer from the second principal surface side along portions where the metal film is not formed on the dicing regions,
   wherein step (c) comprises:
      forming a first metal film on the second principal surface of the semiconductor wafer,
      removing sections of the first metal film coinciding with the dicing regions, and
      forming a second metal film on the first metal film remaining on the second principal surface, and
   wherein the first metal film functions as a plating seed layer and the second metal film is formed by plating on the first metal film.

2. The method according to claim 1, wherein the step of removing the sections of the first metal film coinciding with the dicing regions comprises:
   forming on the first metal film a resist mask having an open portion along the dicing regions, and
   etching the first metal film via the resist mask.

3. The method according to claim 2, wherein the open portion is formed as a result of the resist mask being exposed to light using a glass mask that has been aligned on the basis of alignment marks formed on the first principal surface of the semiconductor wafer.

4. The method according to claim 1, wherein the first metal film is configured by a metal whose ionization tendency is larger than the ionization tendency of the metal configuring the second metal film.

5. The method according to claim 4, wherein the first metal film includes aluminum and the second metal film includes gold.

6. The method according to claim 5, wherein the second metal film includes a nickel plating layer and a gold plating layer.

7. A semiconductor device fabricated by the method of claim 1.

8. A method of fabricating a semiconductor device, said method comprising:
   (a) forming semiconductor elements in plural element regions surrounded by elongated dicing regions on a first principal surface of a semiconductor wafer;
   (b) grinding a second principal surface, on a side of the semiconductor wafer opposite the first principal surface, in such a way that an outer peripheral portion the semiconductor wafer becomes thicker than an inner portion of the semiconductor wafer;
   (c) forming a metal film, in such a way as to avoid sections corresponding to the dicing regions, on the second principal surface that has been ground in the grinding step; and
   (d) cutting the semiconductor wafer from the second principal surface side along portions where the metal film is not formed on the dicing regions,
   wherein step (c) comprises:
      forming a first metal film on the second principal surface of the semiconductor wafer,
      removing sections of the first metal film coinciding with the dicing regions, and
      forming a second metal film on the first metal film remaining on the second principal surface,
   wherein the step of removing the sections of the first metal film coinciding with the dicing regions comprises:
      forming on the first metal film a resist mask having an open portion along the dicing regions, and
      etching the first metal film via the resist mask, and
   wherein the open portion is formed as a result of the resist mask being exposed to light using a glass mask that has been aligned on the basis of alignment marks formed on the first principal surface of the semiconductor wafer.

9. The method according to claim 8, wherein the first metal film functions as a plating seed layer and the second metal film is formed by plating on the first metal film.

10. The method according to claim 9, wherein the first metal film is configured by a metal whose ionization tendency is larger than the ionization tendency of the metal configuring the second metal film.

11. The method according to claim 10, wherein the first metal film includes aluminum and the second metal film includes gold.

12. The method according to claim 11, wherein the second metal film includes a nickel plating layer and a gold plating layer.

13. A semiconductor device fabricated by the method of claim 8.

14. A method of fabricating a semiconductor device, said method comprising:
(a) forming semiconductor elements in plural element regions surrounded by elongated dicing regions on a first principal surface of a semiconductor wafer;
(b) grinding a second principal surface, on a side of the semiconductor wafer opposite the first principal surface, in such a way that an outer peripheral portion of the semiconductor wafer becomes thicker than an inner portion of the semiconductor wafer;
(c) forming a metal film, in such a way as to avoid sections corresponding to the dicing regions, on the second principal surface that has been ground in the grinding step; and
(d) cutting the semiconductor wafer from the second principal surface side along portions where the metal film is not formed on the dicing regions,
wherein step (c) comprises:
forming a first metal film on the second principal surface of the semiconductor wafer,
removing sections of the first metal film coinciding with the dicing regions, and
forming a second metal film on the first metal film remaining on the second principal surface,
wherein the first metal film functions as a plating seed layer and the second metal film is formed by plating on the first metal film, and
wherein the first metal film is configured by a metal whose ionization tendency is larger than the ionization tendency of the metal configuring the second metal film.

15. The method according to claim 14, wherein the step of removing the sections of the first metal film coinciding with the dicing regions comprises:
forming on the first metal film a resist mask having an open portion along the dicing regions, and
etching the first metal film via the resist mask.

16. The method according to claim 15, wherein the open portion is formed as a result of the resist mask being exposed to light using a glass mask that has been aligned on the basis of alignment marks formed on the first principal surface of the semiconductor wafer.

17. The method according to claim 14, wherein the first metal film includes aluminum and the second metal film includes gold.

18. The method according to claim 17, wherein the second metal film includes a nickel plating layer and a gold plating layer.

19. A semiconductor device fabricated by the method of claim 14.

* * * * *